US009742389B2

(12) United States Patent
Maekawa et al.

(10) Patent No.: US 9,742,389 B2
(45) Date of Patent: Aug. 22, 2017

(54) SEMICONDUCTOR DEVICE AND CONTROL METHOD THEREOF

(71) Applicant: Sanken Electric Co., LTD., Niiza-shi, Saitama (JP)

(72) Inventors: Yuya Maekawa, Niiza (JP); Katsuyuki Torii, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 518 days.

(21) Appl. No.: 14/297,670

(22) Filed: Jun. 6, 2014

(65) Prior Publication Data

US 2014/0362490 A1 Dec. 11, 2014

(30) Foreign Application Priority Data

Jun. 11, 2013 (JP) ................................. 2013-122820

(51) Int. Cl.
*H02H 5/04* (2006.01)
*H03K 17/082* (2006.01)
*H03K 17/08* (2006.01)

(52) U.S. Cl.
CPC . *H03K 17/0828* (2013.01); *H03K 2017/0806* (2013.01); *H03K 2217/0027* (2013.01)

(58) Field of Classification Search
USPC ....................................................... 361/103
See application file for complete search history.

(56) References Cited

U.S. PATENT DOCUMENTS

| 4,893,158 | A | * | 1/1990 | Mihara | H01L 27/0251 257/341 |
|---|---|---|---|---|---|
| 5,008,586 | A | * | 4/1991 | Miyazaki | H03K 17/0822 323/315 |
| 5,128,823 | A | * | 7/1992 | Fujimoto | H03K 17/08 327/387 |
| 5,390,069 | A | * | 2/1995 | Marshall | H03K 17/0822 361/103 |
| 5,608,595 | A | * | 3/1997 | Gourab | H03K 17/0826 361/101 |

(Continued)

FOREIGN PATENT DOCUMENTS

| JP | H02-067767 A | 3/1990 |
|---|---|---|
| JP | H09-102505 A | 4/1997 |

(Continued)

OTHER PUBLICATIONS

Mar. 21, 2017 (drafting date Mar. 16, 2017)—(JP) Notification of Reasons for Refusal—App 2013-122820, Eng Tran.

*Primary Examiner* — Ronald W Leja
(74) *Attorney, Agent, or Firm* — Banner & Witcoff, Ltd.

(57) ABSTRACT

A semiconductor device includes a switching element chip, in which a switching element is formed; a first sensing element, which is provided in the switching element chip and is configured to detect first output voltage based on an operating current of the switching element; a second sensing element, which is provided outside the switching element chip and is configured to detect second output voltage based on the operating current of the switching element; and a control circuit, which detects the operating current based on the second output voltage and interrupts the switching element, based on the first output voltage of the first sensing element and the detected operating current, when the switching element is overheated.

16 Claims, 6 Drawing Sheets

(56) References Cited

U.S. PATENT DOCUMENTS

| | | | |
|---|---|---|---|
| 6,268,986 B1* | 7/2001 | Kobayashi | H02P 29/0088 361/24 |
| 2007/0103830 A1* | 5/2007 | Logiudice | H03K 17/0822 361/91.1 |
| 2007/0284664 A1* | 12/2007 | Okuda | H01L 23/34 257/355 |
| 2008/0043393 A1* | 2/2008 | Petkov | H02H 5/041 361/103 |
| 2013/0153900 A1 | 6/2013 | Kinouchi et al. | |
| 2014/0167797 A1* | 6/2014 | Aerts | G05F 1/573 324/750.3 |
| 2014/0176120 A1* | 6/2014 | Aerts | G01R 1/203 324/123 R |
| 2014/0362490 A1* | 12/2014 | Maekawa | H03K 17/0828 361/103 |

FOREIGN PATENT DOCUMENTS

| | | |
|---|---|---|
| JP | 2011-142700 A | 7/2011 |
| JP | 2011-151157 A | 8/2011 |
| WO | 2012/029652 A1 | 3/2012 |

* cited by examiner

SEMICONDUCTOR DEVICE AND CONTROL METHOD THEREOF

CROSS-REFERENCE TO RELATED APPLICATION

This application claims priority from Japanese Patent Application No. 2013-122820 filed on Jun. 11, 2013, the entire subject matter of which is incorporated herein by reference.

TECHNICAL FIELD

This disclosure relates to a semiconductor device which includes a switching element and a control circuit performing control for overcurrent protection and overheat protection on the switching element. Also, this disclosure relates to a control method of the semiconductor device.

BACKGROUND

As a switching element (a power semiconductor device) performing a high-current switching operation, a power MOSFET, an insulated gate bipolar transistor (IGBT), or the like is used. In a semiconductor device using this switching element, if an overcurrent flows due to a cause such as short-circuiting of a load, or an excessive temperature rise occurs, the switching element may be broken down. Accordingly, in a case where a current flowing in the switching element exceeds a predetermined value, it is effective to make the semiconductor device perform an operation of forcibly interrupting the switching element (an overcurrent protection operation). Also, in a case where the switching element has overheated and the temperature of the switching element exceeds a predetermined value, it is effective to make the semiconductor device perform an operation of forcibly interrupting the switching element (an overheat protection operation).

In this case, the temperature can be measured by attaching a temperature detecting device such as a thermocouple to a semiconductor chip. However, in a case of using a temperature detecting device separate from the semiconductor chip, it is difficult to accurately measure the temperature of the semiconductor chip without a delay. For this reason, it is effective to form a temperature detecting device together with the switching element (such as a power MOSFET or an IGBT) in the semiconductor chip (a semiconductor wafer). In this case, in order to suppress the chip area from increasing, a portion of the switching element (a power MOSFET) may be used for temperature detection. This technology is disclosed in JP-A-2011-142700, for example. In this technology, immediately after the power MOSFET is switched from an OFF state to an ON state, a reverse current flowing in a p-n junction (a parasitic diode) formed in the structure of the power MOSFET is examined.

In the technology disclosed in JP-A-2011-142700, a reverse recovery time (or a reverse recovery current) of the parasitic diode is measured, whereby the temperature is estimated. The measured temperature is the temperature of the p-n junction constituting a portion of the switching element (the power MOSFET). Therefore, it is possible to more accurately measure the temperature without a delay as compared to a case of using a temperature detecting device. Also, it is unnecessary to separately form a structure for temperature detection in the semiconductor chip.

In an intelligent power module (IPM), a switching element chip containing a switching element, and a control circuit chip containing a control circuit for performing the above described control (an overcurrent protection operation and an overheat protection operation) are sealed inside the same package. Therefore, it is possible to safely use the switching element.

SUMMARY

However, one of causes of a rise in the temperature of the switching element is that a large amount of current flows when the switching element is ON. For this reason, it is often a case that the temperature of the switching element becomes the highest after a predetermined time elapses from the time when the switching element is turned on.

In contrast to this, in the above described technology, the temperature is measured only immediately after the switching element is switched from an OFF state to an ON state. For this reason, in the above described technology, it is difficult to measure the temperature at a time point when the necessity to monitor the temperature is the greatest and the temperature becomes the highest.

That is, it is difficult to obtain a semiconductor device capable of accurately monitoring the temperature, thereby appropriately performing an overheat protection operation.

With consideration of the above, this disclosure is to provide a semiconductor device and the control method of the semiconductor device.

This disclosure has the following configurations. A semiconductor device includes: a switching element chip, in which a switching element is formed; a first sensing element, which is provided in the switching element chip and is configured to detect first output voltage based on an operating current of the switching element; a second sensing element, which is provided outside the switching element chip and is configured to detect second output voltage based on the operating current of the switching element; and a control circuit, which detects the operating current based on the second output voltage and interrupts the switching element, based on the first output voltage of the first sensing element and the detected operating current, when the switching element is overheated.

Since this disclosure is configured as described above, it is possible to obtain a semiconductor device capable of accurately monitoring the temperature, thereby appropriately performing an overheat protection operation.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Hereinafter, a semiconductor device according to an embodiment of this disclosure will be described. This semiconductor device uses an IGBT as a switching element. The semiconductor device is an IPM, which includes the IGBT, and a control circuit for performing an operation of forcibly interrupting the IGBT according to an operating current flowing in the IGBT and the temperature of the IGBT. In this case, it is possible to accurately detect the temperature particularly during an operation of the IGBT, and thus it is possible to appropriately perform an operation (an overheat protection operation) of forcibly interrupting the IGBT during high temperature. Also, it is possible to perform an operation (an overcurrent protection operation) of forcibly interrupting the IGBT when an overcurrent flows. To this end, during an operation of the IGBT, the operating current (a current flowing between the emitter and the collector) and temperature of the IGBT are monitored. In this case, both of the operating current and the current may be measured using a detection current obtained by branching a portion of the operating current.

First Embodiment

In a semiconductor device according to a first embodiment, the emitter current path of an IGBT which is a switching element has three branches, and one of the three branches is connected directly to the emitter terminal, and the other two branches are connected to the emitter terminal through different sensing elements (a first sensing element and a second sensing element), respectively. If a first detection current and a second detection current flow in the two sensing elements, respectively, voltages are generated. These voltages are measured and are used to measure the operating current and temperature of the IGBT.

Figure 1:
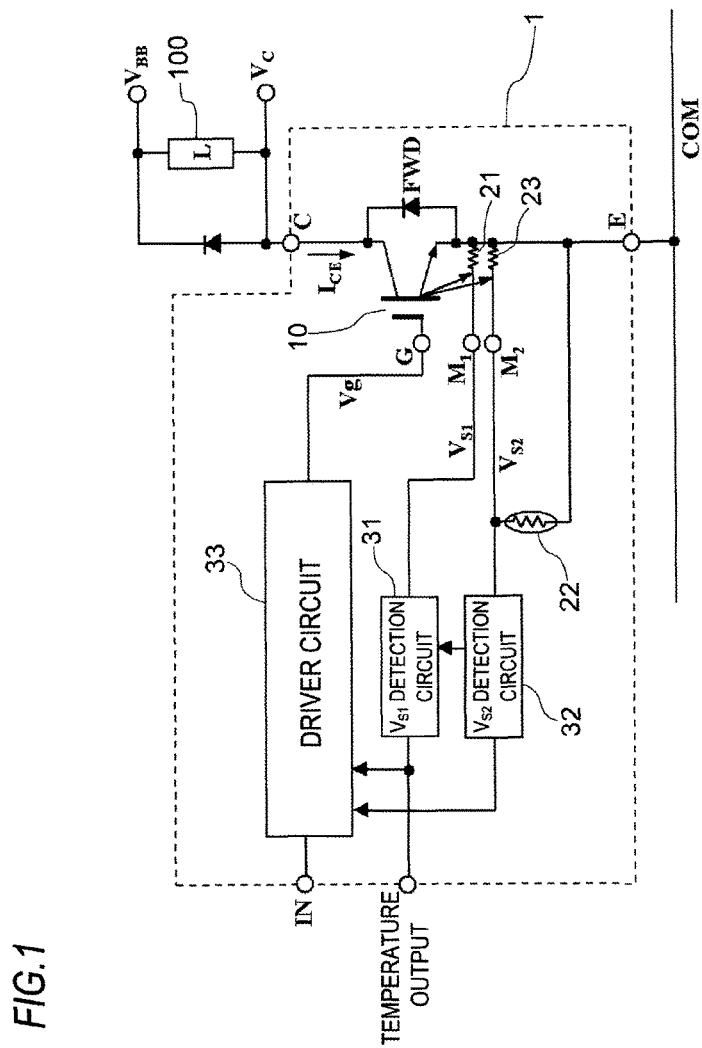
FIG. 1 is a circuit diagram illustrating a semiconductor device according to a first embodiment of this disclosure.

FIG. 1 is a circuit diagram illustrating a configuration of a semiconductor device 1. The semiconductor device 1 uses an IGBT 10 as a switching element. The IGBT 10 is formed in a semiconductor chip (a switching element chip) which is composed principally of silicon. In the IGBT 10, an emitter (E) side output has three branches, and for the sake of convenience, the IGBT 10 is shown by an electronic symbol as shown in FIG. 1. The detailed structure of the IGBT 10 will be described below. However, the operation of the IGBT 10 is the same as that of a generally known IGBT.

A switching operation of the IGBT 10 is determined by the gate (G) voltage Vg, and the collector (C) side of the IGBT 10 is connected to a load 100 which is driven by a voltage ($V_{BB}$-$V_C$). The voltage $V_C$ is the collector voltage of the IGBT 10, and if the IGBT 10 is turned on, whereby the voltage $V_C$ decreases, a current flows in the load 100. That is, the IGBT 10 is used to perform a switching operation of the load 100.

The emitter electrode of the IGBT 10 has three branches, and one of the branches is connected directly to the emitter terminal E. The other two branches are connected to ends of a first sensing element (a sensing element) 21 and a resistor 23, respectively, and the other ends of the first sensing element 21 and the resistor 23 are connected to the emitter terminal E. The first detection current branched from an operating current $I_{CE}$ on the emitter terminal side flows in the first sensing element 21. At this time, a voltage generated between both ends of the first sensing element 21 is detected as an output voltage $V_{S1}$ at a terminal $M_1$.

Meanwhile, at the one end of the resistor 23, a terminal $M_2$ is provided, and the terminal $M_2$ is connected to one end of a second sensing element (a sensing element) 22. The other end of the second sensing element 22 is connected to the emitter terminal E. Therefore, the voltage of the terminal $M_2$ becomes the voltage between both ends of the resistor 23 and the voltage between both ends of the second sensing element 22. Here, if the resistance value of the resistor 23 and the resistance value of the second sensing element 22 are represented by $R_C$ and $R_2$, respectively, and are set such that the resistance value $R_C$ is much greater than the resistance value $R_2$, a portion of the operating current branched to the resistor (23) side hardly flow in the resistor 23 and flows mainly in the second sensing element (22) side. Therefore, actually, regardless of existence or non-existence of the resistor 23, most of the current (the second detection current) branched to the resistor (23) side flows in the second sensing element 22, and an output voltage $V_{S2}$ of the second sensing element 22 is detected at the terminal $M_2$. Similarly to the first detection current, the second detection current also becomes a current branched from the operating current $I_{CE}$. The output voltage $V_{S1}$ of the first sensing element 21 (the potential of the one end of the first sensing element 21) and the output voltage $V_{S2}$ of the second sensing element 22 (the potential of the one end of the second sensing element 22) are detected through the terminals $M_1$ and $M_2$ by a $V_{S1}$ detection circuit 31 and a $V_{S2}$ detection circuit 32, respectively. The voltages $V_{S1}$ and $V_{S2}$ are proportional to the first detection current and the second detection current, respectively, and both of the first detection current and the second detection current are proportional to the operating current $I_{CE}$. Also, between the collector and emitter of the IGBT 10, a recovery diode FWD is connected.

Here, the first sensing element 21 is a resistive element which is formed in the switching element chip containing the IGBT 10. Meanwhile, the second sensing element 22 is a resistive element which is separately provided away from the switching element chip. Since a resistance value generally depends on temperature, both of the resistance value $R_1$ of the first sensing element 21 and the resistance value $R_2$ of the second sensing element 22 monotonically vary, depending on the temperatures of the first sensing element 21 and the second sensing element 22, respectively. Here, the resistance value $R_1$ is much greater than the resistance value $R_2$. In this case, since the first sensing element 21 is formed in the IGBT 10, the resistance value $R_1$ is expressed by a function of the temperature T of the IGBT 10. Meanwhile, the temperature of the second sensing element 22 is different from the temperature T of the IGBT 10. Especially, if the second sensing element 22 is spaced apart from the IGBT 10 such that it is possible to ignore influence of heat generation of the IGBT 10, a variation in the temperature of the second sensing element 22 is negligible as compared to a variation in the temperature T of the IGBT 10. That is, it can be considered that the resistance value $R_1$ of the first sensing element 21 obviously depends on the temperature, whereas the resistance value $R_2$ of the second sensing element 22 is constant. Alternatively, during overheating of the IGBT 10, a variation in the resistance value $R_2$ of the second sensing element 22 is smaller than a variation in the resistance value $R_1$ of the first sensing element 21.

Therefore, the voltage $V_{S1}$ is expressed by a function $V_{S1}$ (T, $I_{CE}$) of the temperature T and the collector current $I_{CE}$. Although it is generally impossible to estimate the temperature T and the operating current $I_{CE}$ only on the basis of an actually measured value of the voltage $V_{S1}$, if the collector current $I_{CE}$ is known, it is possible to calculate the temperature T. Meanwhile, the voltage $V_{S2}$ is expressed by a function $V_{S2}$ ($I_{CE}$) of only the collector current $I_{CE}$. The relation between the voltage $V_{S2}$ and the collector current $I_{CE}$ can be recognized in advance based on the resistance value $R_2$ of the second sensing element 22 or the like. Accordingly, it is possible to calculate the operating current $I_{CE}$ based on the actually measured voltage $V_{S2}$. If the operating current $I_{CE}$ calculated based on the voltage $V_{S2}$ is considered, it is possible to express the voltage $V_{S1}$ as a function of only the temperature T, and thus it is possible to calculate the temperature T on the basis of an actually measured value of the voltage $V_{S1}$. That is, the voltages $V_{S1}$ and $V_{S2}$ can be used to calculate the operating current $I_{CE}$ and temperature T of the IGBT 10. In the configuration of FIG. 1, the $V_{S1}$ detection circuit 31 and the $V_{S2}$ detection circuit 32 can recognize the peak values of the voltages $V_{S1}$ and $V_{S2}$ in a predetermined period, and it is possible to use the peak values to calculate the operating current $I_{CE}$ and the temperature T. Also, especially, the $V_{S1}$ detection circuit 31 can perform an arithmetic process (for example, difference calculation) of the voltages $V_{S1}$ and $V_{S2}$, thereby easily calculating the temperature T. Further, the $V_{S1}$ detection circuit 31 can output a voltage corresponding to the temperature T to the outside.

A driver circuit (a control circuit) 33 generally controls the voltage Vg according to an input from a terminal IN, thereby controlling On-AND-OFF of the IGBT 10. Also, the driver circuit 33 can recognize the operating current $I_{CE}$ and the temperature T based on the output of the $V_{S2}$ detection circuit 32 and the output of the $V_{S1}$ detection circuit 31, respectively. In a case where the operating current $I_{CE}$ or the temperature T exceeds a predetermined value, or it is predicted that the operating current $I_{CE}$ or the temperature T will exceed the predetermined value, the driver circuit 33 can control the voltage Vg regardless of the input of the terminal IN, thereby forcibly interrupting the IGBT 10. Therefore, in the configuration of FIG. 1, it is possible to appropriately perform a protection operation (an overcurrent protection operation) based on the operating current $I_{CE}$, and a protection operation (an overheat protection operation) based on the temperature T.

The driver circuit 33, the $V_{S1}$ detection circuit 31, and the $V_{S2}$ detection circuit 32 are configured in a semiconductor chip (a control circuit chip) different from the switching element chip. In the control circuit chip, the second sensing element 22 is provided as a resistive element at a position where the second sensing element 22 is not influenced by a rise in the temperature of the switching element chip. Alternatively, a resistive element provided outside the semiconductor module can be connected to the control circuit chip to be used as the second sensing element 22. The recovery diode FWD may be configured in a semiconductor chip (a diode chip) different from the switching element chip and the control circuit chip. In this case, the recovery diode FWD may not be provided inside the semiconductor module and be connected from the outside to the semiconductor module.

Figure 2A:
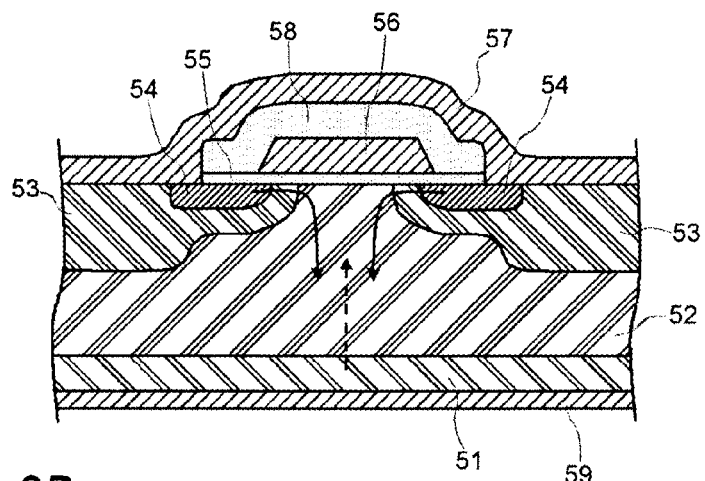
FIGS. 2A to 2C are views illustrating a cross section, electronic symbol, and equivalent circuit of a planar type insulated gate bipolar transistor (IGBT), respectively.
Figure 2B:
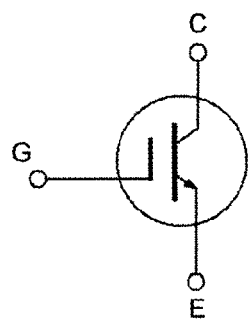
Figure 2C:
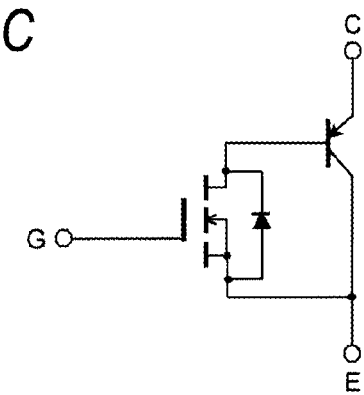
Figure 3:
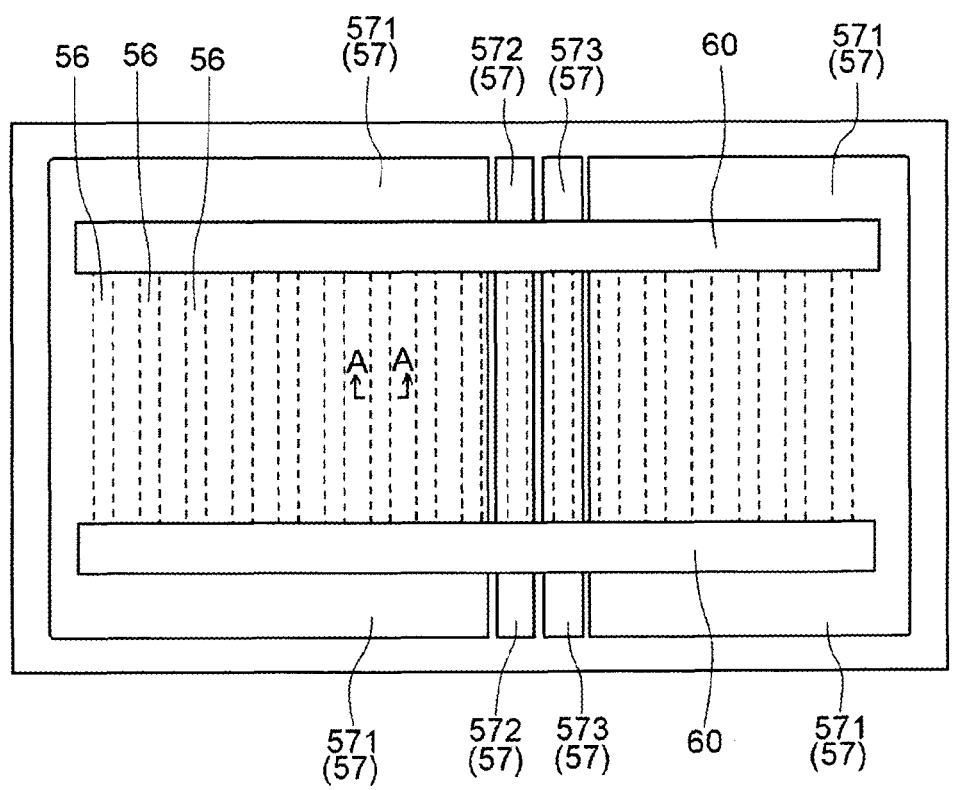
FIG. 3 is a top view illustrating the IGBT which is used in the semiconductor device according to the first embodiment of this disclosure.

Subsequently, the detailed structure of the IGBT 10 of FIG. 1, particularly, the branch structure of the emitter current path will be described. FIG. 2A is a cross-sectional view of a unit structure of a known planar type IGBT, FIG. 2B is a corresponding electronic symbol view, and FIG. 2C is an equivalent circuit thereof. FIG. 3 is a top view illustrating the IGBT 10, and the cross-sectional view of FIG. 2A corresponds to a cross section along a line A-A of FIG. 3, and shows the cross-section structure of a unit structure of the IGBT 10. In this unit structure, on a p$^+$ type layer 51 to be a collector layer, an n$^-$ type layer 52 to be a drift layer is formed. On the front surface side (upper side in the figure) of the n$^-$ type layer 52, p$^-$ type layers (emitter layers) 53 are locally formed by selective impurity diffusion or ion implantation. Further, in the p$^-$ type layers 53, n$^+$ type layers 54 to correspond to source regions of MOSFETs are locally formed by ion implantation. A gate electrode 56 is formed on the front surface with an oxide film (a gate insulating film) 55 interposed therebetween, so as to cover the n$^-$ type layer 52, the p$^-$ type layers 53, and the n$^+$ type layers 54.

Also, on the front surface side, an emitter electrode 57 is formed on the n$^-$ type layer 52 with an interlayer insulating film 58 interposed therebetween, so as not to be in contact with the n$^-$ type layer 52 and so as to be in contact with the p$^-$ type layers 53 and the n$^+$ type layers 54. On the back surface side (lower side in the figure), a collector electrode 59 is formed over the entire surface of the p$^+$ type layer 51. In this structure, during an ON state, electrons flow as shown by solid arrows, and holes flow as shown by a dashed arrow.

The gate electrode 56 is formed so as to extend in a direction perpendicular to the plane of FIG. 2A, and the p$^-$ type layers 53 and the n$^+$ type layers 54 are formed on the left and right sides of the gate electrode 56 so as to extend in parallel with the extension direction of the gate electrode 56. In an actual structure, for a large amount of current to flow between the emitter electrode 57 and the collector electrode 59, a plurality of unit structures as shown in FIG. 2A is formed in parallel in a left-right direction as shown in FIG. 3. In FIG. 3, a plurality of gate electrodes 56 formed in parallel is connected in parallel by gate connection electrodes 60, the IGBT 10 is turned ON or OFF according to the voltage Vg applied to the common gate connection electrodes 60.

Therefore, in order to branch the emitter current path as shown in FIG. 1, according to the structure of FIG. 3 in which the plurality of unit structures are arranged in the left-right direction, the emitter electrode 57 needs only to be divided into a first emitter electrode 571, a second emitter electrode 572, and a third emitter electrode 573. For example, the second emitter electrode 572 is connected to the first sensing element 21 and the third emitter electrode 573 is connected to the second sensing element 22, whereby it is possible to implement the configuration of FIG. 1. FIG. 3 shows the structure of the planar type IGBT. However, even in a trench type IGBT, similarly, it is possible to divide an emitter electrode.

Also, as the first sensing element 21, a diffused resistor (a parasitic resistor) using a p$^-$ type layer (emitter layer) 53 shown as a diffusion layer in FIG. 2A can be used. In this case, actually, it is possible to form diffused resistance using a p$^-$ type layers 53 by setting the planar shape of the p$^-$ type layer 53 to be the same as that of a normal IGBT, and devising the shape of the second emitter electrode 572. In this diffused resistor, for example, if the temperature rises from 25° C. to 150° C., the resistance value increases to about 1.5 times. Therefore, if the first detection current or the operating current $I_{CE}$ is known, it is possible to calculate the temperature T based on the voltage $V_{S1}$. Also, since each p$^-$ type layer 53 constitutes a portion of the IGBT, the measured temperature is the temperature of the IGBT 10 (the switching element chip). Therefore, in the above described configuration, it is possible to accurately measure the temperature T of the IGBT 10, and the driver circuit 33 can use the temperature T to appropriately control the IGBT 10.

Also, since the area of the semiconductor layer connected to the second emitter electrode 572 and the third emitter electrode 573 formed by dividing the emitter electrode 57 is small, the value of a parasitic resistor due to the semiconductor layer is larger than that of a parasitic resistor connected to the first emitter electrode 571. This parasitic resistor can be used as the first sensing element 21 and the resistor 23. In this case, it is easy to set the resistance values $R_1$ and $R_C$ to be much greater than the resistance value $R_2$. Also, in this case, similarly to the resistance value $R_1$, the resistance value $R_C$ also depends on the temperature. However, in the circuit configuration of FIG. 1, as long as the resistance value $R_C$ is much greater than the resistance value $R_2$, the potential of the terminal $M_2$ always becomes the output voltage $V_{S2}$ of the second sensing element 22, and thus it is possible to perform the above described operation. Also, in the third emitter electrode 573, a parasitic resistor may not be formed ($R_C$ to $\infty$).

The above described configuration may be similarly to the technology disclosed in JP-A-2011-142700 in that a component of the IGBT 10 is used to measure the temperature of the IGBT 10. However, in the technology disclosed in JP-A-2011-142700, immediately after the switching element is turned on, the temperature is measured for a short period when a reverse recovery current flows. In contrast to this, in the above described configuration, it is possible to measure the temperature at an arbitrary timing when the switching element is ON (arbitrary timing when the operating current is flowing). Therefore, it is possible to appropriately perform an overheat protection operation with respect to the IGBT 10.

Figure 4A:
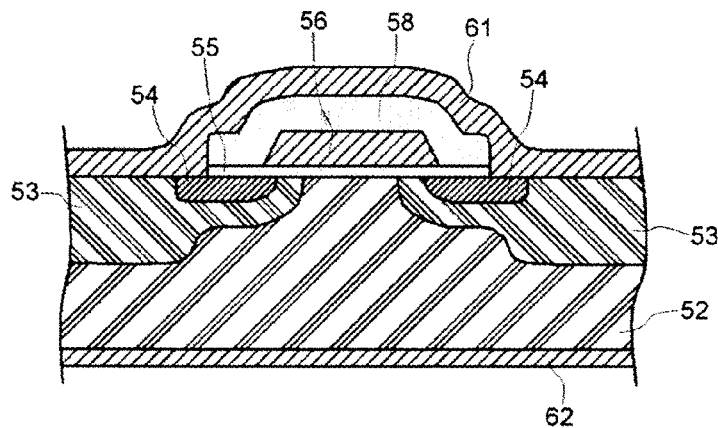
FIGS. 4A and 4B are views illustrating a cross section and equivalent circuit of a planar type power MOSFET, respectively.
Figure 4B:
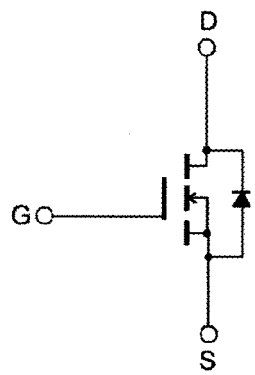

Also, in the technology disclosed in JP-A-2011-142700, the reverse recovery current of the power MOSFET is measured, and thus it is difficult to apply the same technology to a case of an IGBT. This point will be described below. FIGS. 4A and 4B are views respectively illustrating a cross section and equivalent circuit, of a known planar type power MOSFET. FIGS. 4A and 4B correspond to FIGS. 2A and 2C of the IGBT, respectively. As shown in FIG. 4A, the power MOSFET has the same structure as that of the IGBT 10 (FIG. 2A) except that the p$^+$ type layer 51 to be the collector region does not exist. A front surface side electrode is composed of a source electrode 61, and the back surface side electrode is composed of a drain electrode 62. FIG. 4A shows a cross section of a unit structure of the power MOSFET. However, actually, a plurality of unit structures is formed as shown in FIG. 3.

In an equivalent circuit (FIG. 4B) of the power MOSFET, a p-n junction between the n$^-$ type layer 52 and the p$^-$ type layer 53 acts as a parasitic diode. This parasitic diode is reversely biased when the power MOSFET is ON. Therefore, in the technology disclosed in JP-A-2011-142700, the reverse recovery current of the parasitic diode is measured, whereby the temperature is measured. Also, with respect to the power MOSFET, the parasitic diode acts similarly to the recovery diode FWD of the circuit of FIG. 1.

In contrast to this, as shown in FIG. 2C, the equivalent circuit of the IGBT becomes a form in which a pnp type bipolar transistor is connected between the drain and source of a power MOSFET. Therefore, in the equivalent circuit, locally, a parasitic diode is formed as shown in FIG. 4B. However, it is difficult to measure the reverse current of the parasitic diode or, in the power MOSFET, actually, a parasitic diode is not formed. Also, since a parasitic diode is not formed as described above, in the circuit of FIG. 1, the recovery diode FWD is connected between the collector and the emitter. For this reason, it is difficult to apply the technology disclosed in JP-A-2011-142700 and using a parasitic diode to an IGBT. In contrast to this, as described above, the technology according to the embodiment of this disclosure can be applied to an IGBT.

Meanwhile, even in the power MOSFET, as shown in FIG. 3 (the IGBT 10), a plurality of unit structures as shown in FIG. 4A is arranged and individually electrodes are connected in parallel. To this end, as the emitter electrode 57 of the IGBT 10 is divided such that the collector current $I_{CE}$ branches, the source electrode 61 can be divided such that a drain current branches. That is, it is also obvious that the configuration of FIG. 1 can be applied to a power MOSFET. In this case, it is also obvious that it is possible to similarly form the first sensing element and it is possible to measure the temperature at an arbitrary timing when the power MOSFET is ON.

Figure 5:
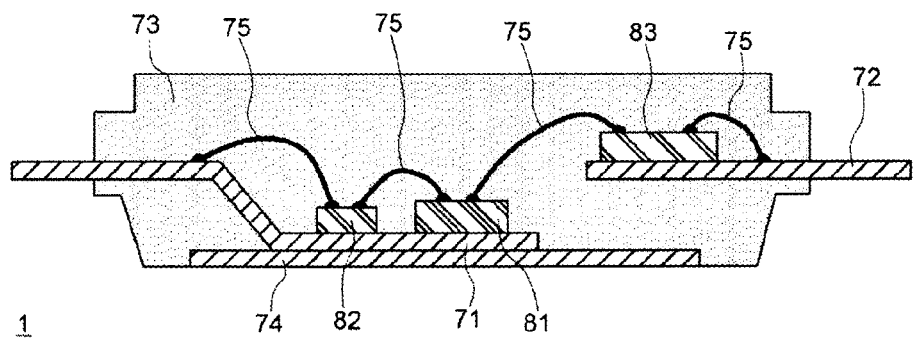
FIG. 5 is a cross-sectional view illustrating the structure of the semiconductor device (a semiconductor module) according to the first embodiment of this disclosure.

FIG. 5 is a cross-sectional view illustrating an example of the structure of the semiconductor device 1 (the semiconductor module) having the configuration of FIG. 1. In this structure, a semiconductor chip to be used is mounted using a lead frame (a first lead frame) 71 and a lead frame (a second lead frame) 72 separated from each other, and a mold layer 73 which is formed of a resin material. In FIG. 5, the left end of the lead frame 71 and the right end of the lead frame 72 protrude from the mold layer 73, and they become lead terminals of the semiconductor module. Also, actually, on the left and the right, a plurality of lead terminals is arranged in a direction perpendicular to the paper plane of FIG. 5, and acts as a plurality of terminals for input and output of the circuit of FIG. 1.

A switching element chip 81 containing the IGBT 10 of FIG. 1, and a diode chip 82 containing the recovery diode FWD are mounted on the left lead frame 71. As described above, the switching element chip 81 also contains the first sensing element 21 as a portion of a component of the IGBT 10. Since a large amount of current flows in each of the switching element chip 81 and the diode chip 82, it is necessary of efficiently perform heat radiation of these chips. For this reason, on the back surface of the lead frame 71, a heat sink 74 is bonded, and the heat sink 74 is exposed from the back surface side of the mold layer 73. Although the thermal conductivity of the resin material forming the mold layer 73 is low, according to this configuration, it is possible to efficiently perform heat radiation from the switching element chip 81 and the diode chip 82.

Meanwhile, a control circuit chip 83 containing the $V_{S1}$ detection circuit 31, the $V_{S2}$ detection circuit 32, the driver circuit 33, and the second sensing element 22 shown in FIG. 1 is mounted on the right lead frame 72. Bonding wires 75 are connected between the switching element chip 81, the diode chip 82 and the lead frame 71, between the switching element chip 81 and the control circuit chip 83, between the control circuit chip 83 and the lead frame 72, and the like, such that the circuit of FIG. 1 is configured.

On the top surfaces of the switching element chip 81, the diode chip 82, and the control circuit chip 83, bonding pads for connecting the bonding wires are appropriately formed.

As described above, it is preferable to provide the second sensing element 22 at a position where the second sensing element 22 is not influenced by heat radiation of the IGBT 10. Also, in order to make the $V_{S1}$ detection circuit 31, the $V_{S2}$ detection circuit 32, and the driver circuit 33 operate appropriately, it is preferable to suppress the control circuit chip 83 containing those circuits from becoming a high temperature. For this reason, in the above described configuration, in the mold layer 73 having low thermal conductivity, the control circuit chip 83 is spaced apart from the switching element chip 81 and the diode chip 82, and is mounted on a lead frame different from that for the switching element chip 81 and the diode chip 82. In this case, it is possible to ignore heat conduction of the thin bonding wires 75.

The internal structure of the semiconductor module can be set as shown in FIG. 5, whereby it is possible to implement the circuit configuration of FIG. 1 and to make the semiconductor module operate appropriately. As long as it is possible to reduce heat conduction from the switching element chip to the control circuit chip, it is possible to use any other structure. Also, as described above, the second sensing element 22 may be connected to the outside of the configuration of FIG. 5.

Second Embodiment

Figure 6:
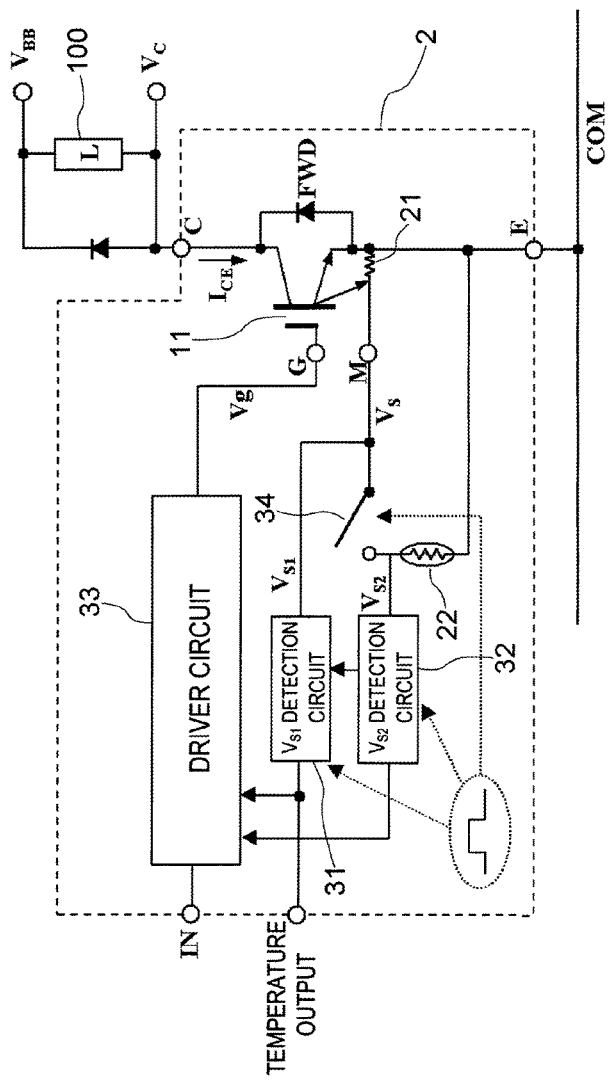
FIG. 6 is a circuit diagram illustrating a semiconductor device according to a second embodiment of this disclosure.

Even in a semiconductor device according to a second embodiment, similarly, it is possible to accurately monitor the temperature of an IGBT. However, a circuit configuration for this is different from that of the first embodiment. FIG. 6 is a view illustrating a configuration of a semiconductor device 2. Unlike in the first embodiment, the emitter electrode of an IGBT 11 for the semiconductor device 2 has two branches. One of the branches is connected directly to the emitter terminal E, and the other branch is connected to one end of the first sensing element 21. Also, the other branch is connected to the one end of the first sensing element 21, and the other end of the first sensing element 21 is connected to the emitter terminal E. In this IGBT 11, from the other branch, only a detection current with single lineage is output. Also, the one end of the first sensing element 21 is connected to a terminal M, and the terminal M is connected to one end of a switch 34. The other end of the switch 34 is connected to the $V_{S2}$ detection circuit 32.

As described above in the first embodiment, the resistance value $R_1$ is much greater than the resistance value $R_2$. For this reason, in a case where the switch 34 is OFF (a state shown in FIG. 6), the voltage (monitor voltage) VS of the terminal M becomes the voltage $V_{S1}$ which is the first output voltage of the first sensing element 21. Meanwhile, in a case where the switch 34 is ON, the voltage VS of the terminal M actually becomes the voltage $V_{S2}$ which is the second output voltage of the second sensing element 22. Also, as the switch 34, actually, an electronic switching element such as a MOSFET is used and is switched between ON and OFF by a pulse signal. The pulse signal is also input to the $V_{S1}$ detection circuit 31 and the $V_{S2}$ detection circuit 32, whereby control is performed such that in a case where the switch 34 is OFF, the $V_{S1}$ detection circuit 31 becomes effective, and in a case where the switch 34 is ON, the $V_{S2}$ detection circuit 32 becomes effective. Therefore, similarly to the first embodiment, it is possible to detect the voltage $V_{S1}$ (based on of the temperature T and the operating current $I_{CE}$) and to detect the voltage $V_{S2}$ (based on the operating current $I_{CE}$.) Therefore, similarly to the first embodiment, it is possible to calculate the operating current $I_{CE}$ and the temperature T. Based on the operating current $I_{CE}$ and the temperature T calculated, it is possible to similarly perform an overcurrent protection operation and an overheat protection operation.

Figure 7:
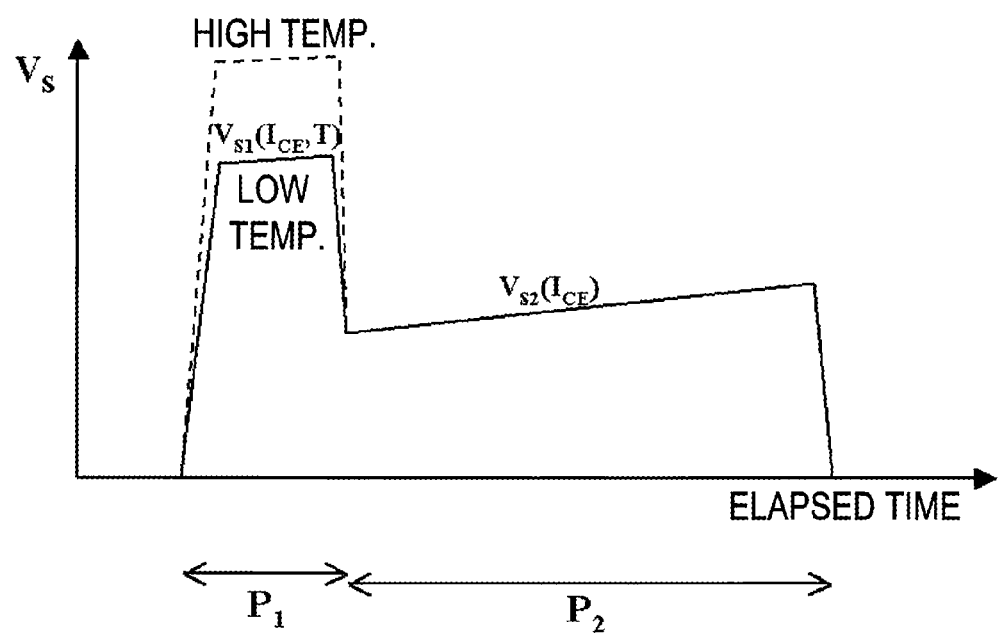
FIG. 7 is a view illustrating an example of a temporal variation in a monitor voltage VS which is detected in the semiconductor device according to the second embodiment of this disclosure.

In this case, it is possible to use the switch 34 to detect the voltages $V_{S1}$ and $V_{S2}$ at different timings, respectively. FIG. 7 is a view illustrating an example of a temporal variation of the voltage VS of the terminal M in that case. In this example, a period P1 (a $V_{S1}$ detection period) when the switch 34 is first in an OFF state is provided, and thereafter, a period (a $V_{S2}$ detection period) P2 when the switch 34 is in an ON state is provided. In this configuration, after the period P2 finishes, it is possible to calculate the operating current $I_{CE}$ and the temperature T. Setting of the periods P1 and P2 is arbitrary. The periods P2 and P1 can be set in this order, or can be set to be repeated with a short cycle. That is, the switch 34 can be operated at predetermined timings, whereby it is possible to appropriately set the periods P1 and P2. This control can be performed by the controller 30, or can be performed from the outside of the semiconductor device 2. In both cases, it is obvious that it is possible to calculate the operating current $I_{CE}$ and the temperature T. Also, it is obvious that the above described control can be performed at an arbitrary timing when the IGBT 11 is ON.

Similarly to the first embodiment, the IGBT 11 is formed in a switching element chip. In this case, similar to the configuration of FIG. 5, a bonding pad is formed on the switching element chip so as to be connected to the terminal M, and this bonding pad and a bonding pad on the control circuit chip side are connected by a bonding wire such that the circuit of FIG. 6 is formed. In this case, since the bonding pads occupy large areas on those chips, in order to reduce the areas of the chips and reduce the manufacturing cost, it is preferable to reduce the number of bonding pads. In this case, in the configuration of FIG. 6, terminals which are drawn with respect to the IGBT 11 are only the gate terminal G, the collector terminal C, and the emitter terminal E minimally required for a normal operation, and the terminal M for monitoring. Therefore, it is possible to reduce the number of bonding pads for the switching element chip containing the IGBT 11, and to reduce the chip area.

In contrast to this, in the technology disclosed in JP-A-2011-142700, in order to simultaneously perform temperature detection and current detection, it is necessary to independently provide bonding pads for temperature detection and bonding pads for current detection. In general, since each of the number of bonding pads for temperature detection and the number of bonding pads for current detection is two, areas which are occupied by the bonding pads increases, and thus it is difficult to reduce the chip size. That is, in the second embodiment, since the single terminal M can be used to measure the collector current $I_{CE}$ and the temperature T, it is possible to reduce the chip size of the switching element chip containing the IGBT 11. Therefore, it is also obvious that it is possible to reduce the number of bonding pads for the control circuit chip.

That is, in the semiconductor device 2 according to the second embodiment, it is possible to accurately detect the operating current and temperature of the switching element, and it is possible to reduce the number of bonding pads and to reduce the size of the semiconductor chip to be used. Further, it is possible to reduce the number of bonding wires to be used, and thus it is possible to suppress reliability from being degraded due to connection of bonding wires.

Also, since only a detection current with single lineage is branched from the operating current in the IGBT 11, it is possible to reduce the ratio of the detection current with respect to the operating current $I_{CE}$ of the IGBT 11. Therefore, it s possible to reduce various losses due to the detection current flowing in each sensing element.

Also, besides the above described configuration, a variety of circuit configurations are possible, as long as detection currents flow in two kinds of sensing elements to measure the output voltage of each sensing element. Also, as the first sensing element, a device other than a diffused resistor can be used, as long as the alternative element can be formed together with the switching element in the switching element chip and its output voltage depends on temperature. In contrast to the first sensing element, as the second sensing element, an alternative element can be used as long as its output voltage is unlikely to be influenced by a rise in the temperature of the switching element, or it is disposed at a position where it is considered that its temperature will be constant. According to some factors such as the types of the sensing elements, the overall configuration, for example, the structure of the semiconductor module shown in FIG. 5 can be appropriately set.

What is claimed is:

1. A semiconductor device comprising:
    a switching element chip, in which a switching element is formed;
    a first sensing element, which is provided in the switching element chip and is configured to detect a first output voltage based on an operating current of the switching element;
    a second sensing element, which is provided outside the switching element chip and is configured to detect a second output voltage based on the operating current of the switching element; and
    a control circuit, which detects the operating current based on the second output voltage and interrupts the switching element, based on the first output voltage of the first sensing element and the detected operating current, when the switching element is overheated,
    wherein, in the switching element chip, a first detection current and a second detection current are branched from the operating current and then are output, and
    wherein the first detection current flows in the first sensing element, and the second detection current flows in the second sensing element.

2. The semiconductor device according to claim 1, wherein the control circuit interrupts the switching element if the operating current exceeds a predetermined value.

3. The semiconductor device according to claim 1, wherein a variation in a resistance value of the second sensing element according to overheating is set to be smaller than a variation in a resistance value of the first sensing element according to overheating.

4. The semiconductor device according to claim 3, wherein the first sensing element is formed using a diffusion layer which constitutes the switching element in the switching element chip.

5. The semiconductor device according to claim 1, wherein the second sensing element is a resistive element which is formed in the control circuit.

6. The semiconductor device according to claim 1, wherein the switching element is an insulated gate bipolar transistor.

7. The semiconductor device according to claim 1,
    wherein the switching element chip is mounted on a first lead frame,
    wherein the control circuit is mounted on a second lead frame and is separate from the first lead frame, and
    wherein the switching element chip and the control circuit are spaced apart from each other and are sealed in a mold layer.

8. The semiconductor device according to claim 2, wherein a variation in a resistance value of the second sensing element according to overheating is set to be smaller than a variation in a resistance value of the first sensing element according to overheating.

9. The semiconductor device according to claim 8, wherein the first sensing element is formed using a diffusion layer which constitutes the switching element in the switching element chip.

10. The semiconductor device according to claim 2, wherein the second sensing element is a resistive element which is formed in the control circuit.

11. The semiconductor device according to claim 2, wherein the switching element is an insulated gate bipolar transistor.

12. The semiconductor device according to claim 2,
    wherein the switching element chip is mounted on a first lead frame,
    wherein the control circuit is mounted on a second lead frame and is separate from the first lead frame, and
    wherein the switching element chip and the control circuit are spaced apart from each other and are sealed in a mold layer.

13. A semiconductor device comprising:
    a switching element chip, in which a switching element is formed;
    a first sensing element, which is provided in the switching element chip and is configured to detect a first output voltage based on an operating current of the switching element;
    a second sensing element, which is provided outside the switching element chip and is configured to detect a second output voltage based on the operating current of the switching element; and
    a control circuit, which detects the operating current based on the second output voltage and interrupts the switching element, based on the first output voltage of the first sensing element and the detected operating current, when the switching element is overheated,
    wherein win the switching element chip, a detection current with single lineage is branched from the operating current and then is output,
    wherein one of the first output voltage of the first sensing element due to the detection current and the second output voltage of the second sensing element due to the detection current is selected by a switch to detect, and
    wherein the switch is operated at predetermined timings such that a period for detecting the first output voltage of the first sensing element and a period for detecting the second output voltage of the second sensing element are set.

14. The semiconductor device according to claim 13, wherein the control, circuit interrupts the switching element if the operating current exceeds a predetermined value.

15. A control method of a semiconductor device comprising a switching element chip, in which a switching element is formed;
    a first sensing element, which is provided in the switching element chip and is configured to detect a first output voltage based on an operating current of the switching element;
    a second sensing element, which is provided outside the switching element chip and is configured to detect a second output voltage based on the operating current of the switching element; and
    a control circuit, which detects the operating current based on the second output voltage and interrupts the switching element, based on the first output voltage of the first sensing element and the detected operating current, when the switching element is overheated, wherein in the switching element chip, a detection current with single lineage is branched from the operating current and then is output, wherein one of the first output voltage of the first sensing element due to the detection current and the second output voltage of the second sensing element due to the detection current is selected by a switch to detect, and wherein the control method further comprises:

switching of the switch at predetermined timings such that a period for detecting the first output voltage of the first sensing element and a period for detecting the second output voltage of the second sensing element are set.

16. The control method of the semiconductor device according to claim 15, wherein the control circuit interrupts the switching element if the operating current exceeds a predetermined value.

\* \* \* \* \*